US012681295B2

(12) United States Patent (10) Patent No.: US 12,681,295 B2
Odagaki (45) Date of Patent: Jul. 14, 2026

(54) IMAGE DISPLAY DEVICE

(71) Applicant: CANON KABUSHIKI KAISHA, Tokyo (JP)

(72) Inventor: Koichi Odagaki, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 315 days.

(21) Appl. No.: 18/631,273

(22) Filed: Apr. 10, 2024

(65) Prior Publication Data

US 2024/0337827 A1      Oct. 10, 2024

(30) Foreign Application Priority Data

Apr. 10, 2023     (JP) ................................. 2023-063464

(51) Int. Cl.
| | |
|---|---|
| *H05K 1/02* | (2006.01) |
| *G02B 26/10* | (2006.01) |
| *H05K 1/181* | (2026.01) |
| *H05K 1/189* | (2026.01) |

(52) U.S. Cl.
CPC ......... *G02B 26/101* (2013.01); *H05K 1/0271* (2013.01); *H05K 1/181* (2013.01); *H05K 1/189* (2013.01); *H05K 2201/05* (2013.01); *H05K 2201/08* (2013.01); *H05K 2201/10121* (2013.01)

(58) Field of Classification Search
CPC ...... H05K 1/0271; H05K 1/181; H05K 1/189; H05K 2201/05; H05K 2201/08
USPC .......................................... 361/760
See application file for complete search history.

(56) References Cited

U.S. PATENT DOCUMENTS

| | | | |
|---|---|---|---|
| 2013/0016289 A1* | 1/2013 | Hayashiyama ...... H05K 1/0271 | 361/752 |
| 2020/0196496 A1* | 6/2020 | Shin .......................... G06F 1/16 | |

FOREIGN PATENT DOCUMENTS

JP          2017049436 A       3/2017

* cited by examiner

*Primary Examiner* — Andargie M Aychillhum
(74) *Attorney, Agent, or Firm* — Cowan, Liebowitz & Latman, P.C.

(57) ABSTRACT

An image display device includes: a flexible board, a vibrational structure including a light reflecting film for reflecting light, and a molded circuit component including a mounting portion which is electrically connected to the vibrational structure and on which the vibrational structure is mounted and a connecting portion which is electrically and mechanically connected to the flexible board and which has a lower dynamic rigidity than the mounting portion. The flexible board and the vibrational structure are electrically connected via the molded circuit component.

8 Claims, 9 Drawing Sheets

IMAGE DISPLAY DEVICE

BACKGROUND OF THE INVENTION

Field of the Invention

The present invention relates to an image display device.

Description of the Related Art

A vibrational structure for displaying an image by scanning with light is mounted in an image display device that is mounted in a wearable terminal such as a head-mounted display (HMD) or smart glasses. The vibrational structure is electrically and mechanically connected to a flexible board (flexible printed circuits (FPC)) by a bonding wire, for example, as disclosed in Japanese Unexamined Patent Publication No. 2017-49436.

However, it may be difficult to appropriately display an image because a force generated due to bending, vibration, or the like of the flexible board is applied to the vibrational structure via the bonding wire. The bonding wire may be disconnected and thus a dedicated device for forming a bonding wire is necessary. On the other hand, for example, the vibrational structure may be electrically and mechanically connected to the flexible board via a normal board having lower flexibility than the bonding wire. However, in this case, since the force generated due to bending, vibration, or the like of the flexible board is applied to the vibrational structure, it may also be difficult to appropriately display an image.

SUMMARY OF THE INVENTION

Therefore, the present invention provides an image display device that can curb application of a force generated due to bending, vibration, or the like of a flexible board to a vibrational structure.

In order to achieve the aforementioned objective, according to the present invention, there is provided an image display device including: a flexible board; a vibrational structure including a light reflecting film for reflecting light; and a molded circuit component including a mounting portion which is electrically connected to the vibrational structure and on which the vibrational structure is mounted and a connecting portion which is electrically and mechanically connected to the flexible board and which has a lower dynamic rigidity than the mounting portion, wherein the flexible board and the vibrational structure are electrically connected via the molded circuit component.

Further features of the present invention will become apparent from the following description of exemplary embodiments with reference to the attached drawings.

DESCRIPTION OF THE EMBODIMENTS

First Embodiment

Figure 1:
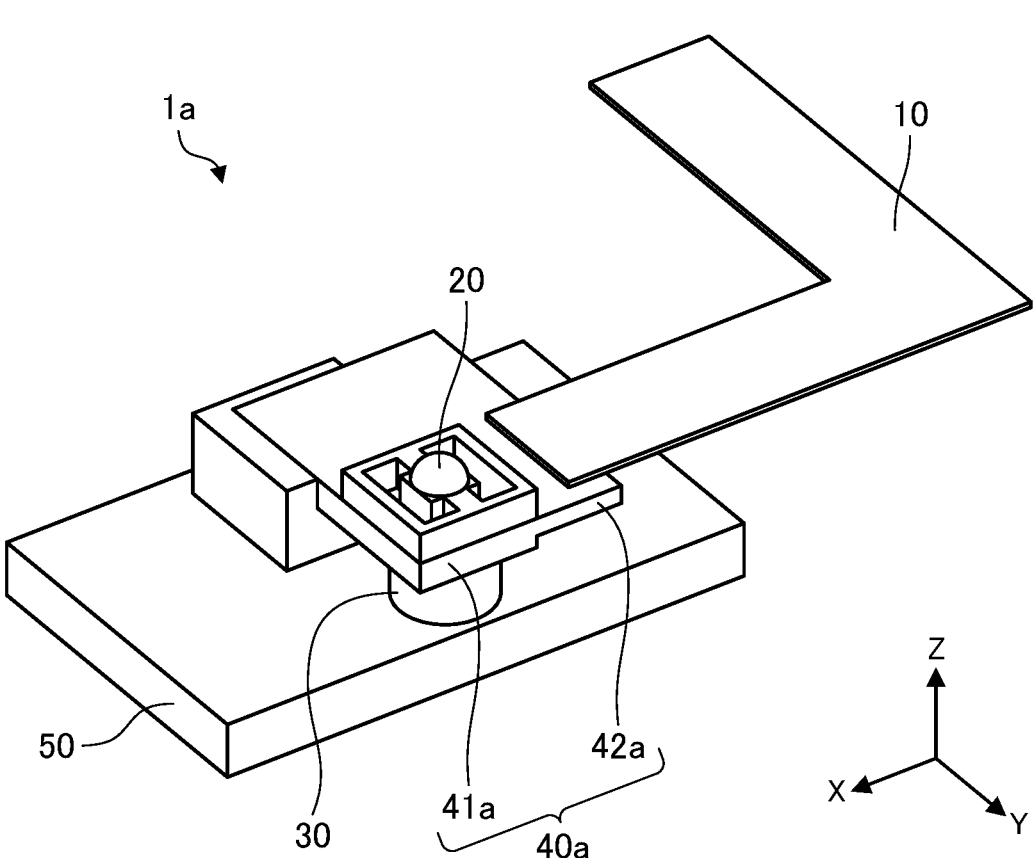
FIG. 1 is a perspective view of an image display device according to a first embodiment.
Figure 2:
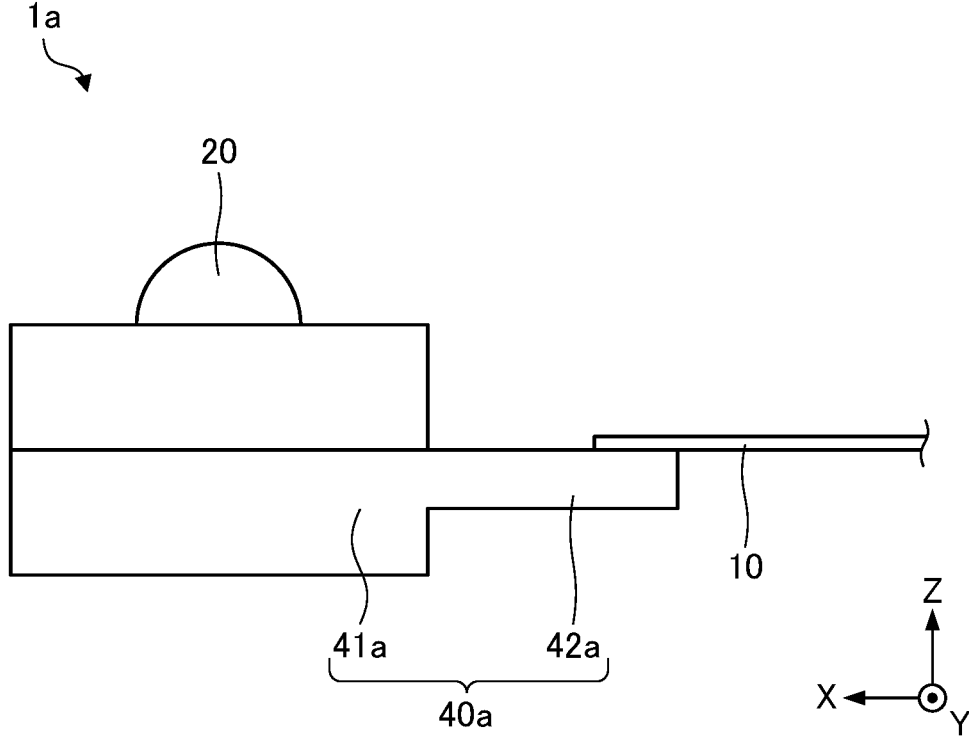
FIG. 2 is a partial view of the image display device according to the first embodiment when seen from a +Y-direction side.

An image display device according to a first embodiment will be described below with reference to FIGS. 1 and 2. FIG. 1 is a perspective view of the image display device according to the first embodiment. FIG. 2 is a partial view of the image display device according to the first embodiment when seen from a +Y-direction side. In the following description, a right-handed three-dimensional orthogonal coordinate system that is defined by an X axis, a Y axis, and a Z axis is used.

As illustrated in FIGS. 1 and 2, an image display device 1a includes a flexible board 10, a vibrational structure 20, a magnetic field generator 30, a molded circuit component 40a, and a base 50.

The flexible board 10 is electrically connected to the molded circuit component 40a. The flexible board 10 is electrically connected to the vibrational structure 20 via the molded circuit component 40a. The flexible board 10 delivers electric power, signals, and the like to be supplied to the vibrational structure 20 and signals and the like output from the vibrational structure 20.

The vibrational structure 20 is, for example, an optical scanner. The vibrational structure 20 includes a light reflecting film for reflecting light and displays an image by performing scanning with light using the light reflecting film. The vibrational structure 20 is electrically connected to the flexible board 10 via the molded circuit component 40a.

The magnetic field generator 30 generates a magnetic field required for activation of the vibrational structure 20 and supplies the generated magnetic field to the vibrational structure 20. As illustrated in FIG. 1, the magnetic field generator 30 is disposed between the molded circuit component 40a and the base 50. The magnetic field generator 30 is disposed at a position overlapping the vibrational structure 20 in the Z direction.

The molded circuit component 40a is a mold interconnect device (MID). The mold interconnect device is a resin-molded product in which wires, electrodes, and the like are formed and electronic components or the like are mounted. The molded circuit component 40a is formed of a single type of resin. The molded circuit component 40a delivers electric power, signals, and the like to be supplied to the vibrational structure 20 and signals and the like output from the vibrational structure 20. As illustrated in FIGS. 1 and 2, the molded circuit component 40a includes a mounting portion 41a and a connecting portion 42a. Examples a method of manufacturing the mold interconnect device include a method of forming wires through plating and in-mold electronics (IME) of unifying film-shaped circuits through insert molding.

The mounting portion 41a is electrically connected to the vibrational structure 20, and the vibrational structure 20 is mounted thereon. The connecting portion 42a is electrically and mechanically connected to the flexible board 10. The connecting portion 42a has a lower dynamic rigidity than the mounting portion 41a. Dynamic rigidity is difficulty in deformation of a structure when a dynamic force is applied to the structure and is set such that a larger value thereof indicates higher difficulty in deformation and a smaller value thereof indicates lower difficulty in deformation. For example, the thickness of the connecting portion 42a is smaller than that of the mounting portion 41a. More specifically, a dimension of the connecting portion 42a in the Z direction is smaller than that of the mounting portion 41a. In other words, a thickness of the connecting portion 42a in a first direction is smaller than that of the mounting portion 41a. The first direction mentioned herein is a direction perpendicular to a surface on which the vibrational structure 20 is mounted. The base 50 is a plate-shaped member supporting the molded circuit component 40a.

The image display device 1a according to the first embodiment has been described above. The image display device 1a includes the molded circuit component 40a including the mounting portion 41a which is electrically connected to the vibrational structure 20 and on which the vibrational structure 20 is mounted and the connecting portion 42a which is electrically and mechanically connected to the flexible board 10 and which has a lower dynamic rigidity than the mounting portion 41a. Accordingly, in the image display device 1a, a force generated due to bending, vibration, or the like of the flexible board 10 is attenuated by the connecting portion 42a. As a result, the image display device 1a can curb application of a force generated due to bending, vibration, or the like of the flexible board 10 to the vibrational structure 20.

The image display device 1a includes the molded circuit component 40a in which the thickness of the connecting portion 42a is smaller than that of the mounting portion 41a. Accordingly, with the image display device 1a, it is possible to easily manufacture the connecting portion 42a having a lower dynamic rigidity than the mounting portion 41a.

Second Embodiment

Figure 3:
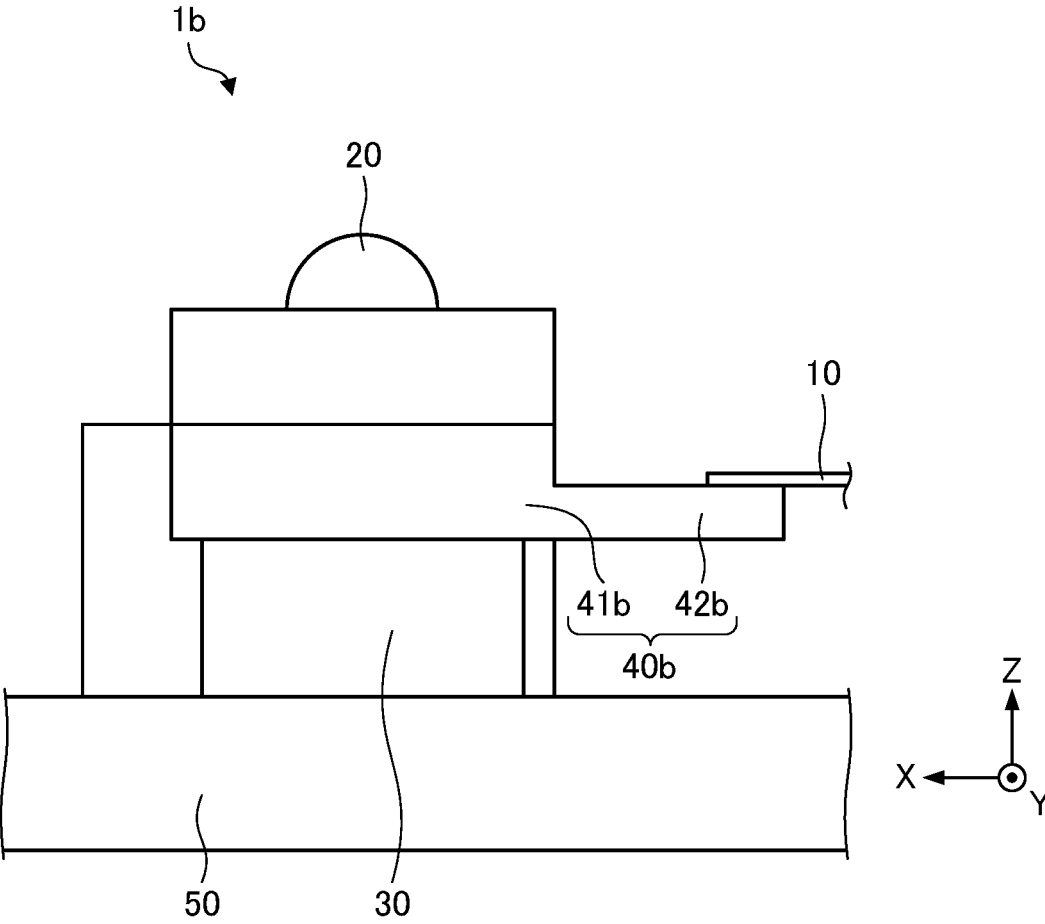
FIG. 3 is a view of an image display device according to a second embodiment when seen from the +Y-direction side.

An image display device according to a second embodiment will be described below with reference to FIG. 3. FIG. 3 is a view of the image display device according to the second embodiment when seen from the +Y-direction side. In description of the second embodiment, the same elements as in the aforementioned embodiment are referred to by the same reference signs. In description of the second embodiment, description of details mentioned in the aforementioned description will be appropriately omitted, and details different from those of the aforementioned embodiment will be mainly described.

As illustrated in FIG. 3, an image display device 1b includes a flexible board 10, a vibrational structure 20, a magnetic field generator 30, a molded circuit component 40b, and a base 50.

The molded circuit component 40b is an MID. The molded circuit component 40b delivers electric power, signals, and the like to be supplied to the vibrational structure 20 and signals and the like output from the vibrational structure 20. As illustrated in FIG. 3, the molded circuit component 40b includes a mounting portion 41b and a connecting portion 42b.

The mounting portion 41b is electrically connected to the vibrational structure 20, and the vibrational structure 20 is mounted thereon. The connecting portion 42b is electrically and mechanically connected to the flexible board 10. The connecting portion 42b has a lower dynamic rigidity than the mounting portion 41b. For example, the thickness of the connecting portion 42b is smaller than that of the mounting portion 41b. More specifically, a dimension of the connecting portion 42b in the Z direction is smaller than that of the mounting portion 41b. The connecting portion 42b is connected to a position farther from the vibrational structure 20 than a position of a surface on which the vibrational structure 20 is mounted on an end surface of the mounting portion 41b. More specifically, as illustrated in FIG. 3, the connecting portion 42b is connected to a position farther in the −Z direction from the vibrational structure 20 than a position in the Z direction of the surface on which the vibrational structure 20 is mounted on an end surface on the −X-direction side of the mounting portion 41b.

The image display device 1b according to the second embodiment has been described above. The image display device 1b includes the molded circuit component 40b in which the thickness of the connecting portion 42b is smaller than that of the mounting portion 41b. Accordingly, with the image display device 1b, it is possible to easily manufacture the connecting portion 42b having a lower dynamic rigidity than the mounting portion 41b.

In the image display device 1b, the connecting portion 42b is connected to the position farther from the vibrational structure 20 than the position of the surface on which the vibrational structure 20 is mounted on the end surface of the mounting portion 41b. Accordingly, a path along which a force generated due to bending, vibration, or the like of the flexible board 10 propagates to the vibrational structure 20 in the image display device 1b is set to be longer than that in the image display device 1a according to the first embodiment. As a result, with the image display device 1b, it is possible to curb application of a force generated due to bending, vibration, or the like of the flexible board 10 to the vibrational structure 20 in comparison with the image display device 1a according to the first embodiment.

Third Embodiment

Figure 4:
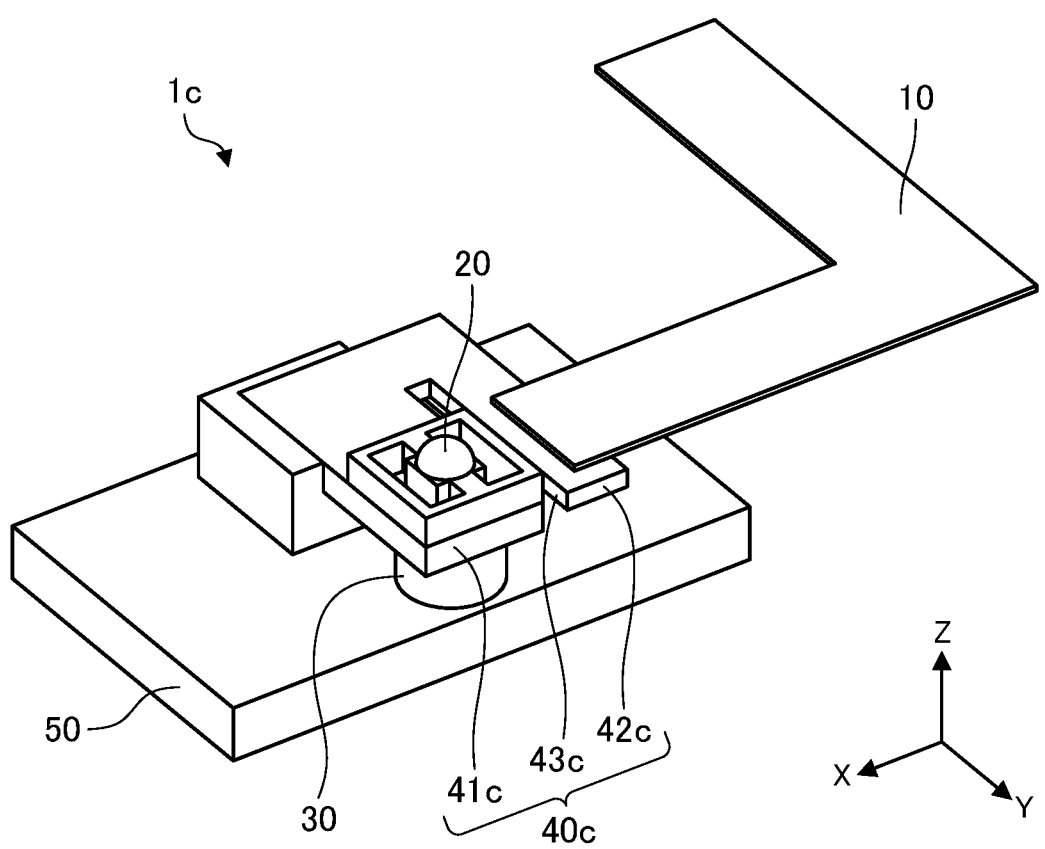
FIG. 4 is a perspective view of an image display device according to a third embodiment.
Figure 5:
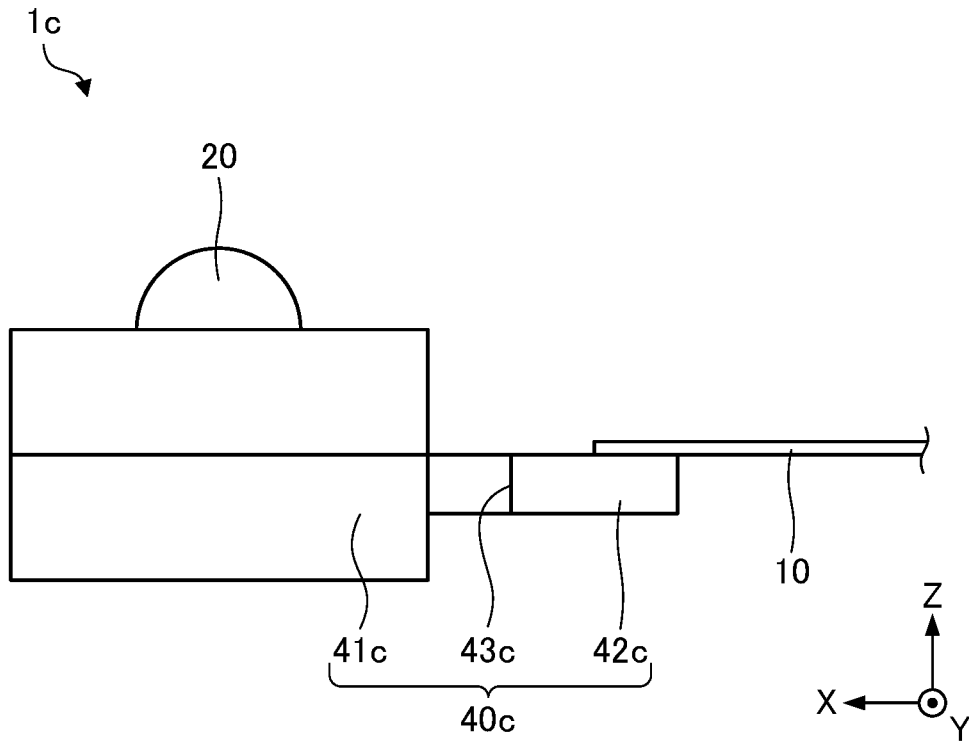
FIG. 5 is a partial view of the image display device according to the third embodiment when seen from the +Y-direction side.

An image display device according to a third embodiment will be described below with reference to FIGS. 4 and 5. FIG. 4 is a perspective view of the image display device according to the third embodiment. FIG. 5 is a partial view of the image display device according to the third embodiment when seen from the +Y-direction side. In description of the third embodiment, the same elements as in the aforementioned embodiments are referred to by the same reference signs. In description of the third embodiment, description of details mentioned in the aforementioned embodiments will be appropriately omitted, and details different from those of the aforementioned embodiments will be mainly described.

As illustrated in FIGS. 4 and 5, an image display device 1c includes a flexible board 10, a vibrational structure 20, a magnetic field generator 30, a molded circuit component 40c, and a base 50.

The molded circuit component 40c is an MID. The molded circuit component 40c delivers electric power, signals, and the like to be supplied to the vibrational structure 20 and signals and the like output from the vibrational structure 20. As illustrated in FIGS. 4 and 5, the molded circuit component 40c includes a mounting portion 41c, a connecting portion 42c, and a cutout 43c.

The mounting portion 41c is electrically connected to the vibrational structure 20, and the vibrational structure 20 is mounted thereon. The connecting portion 42c is electrically and mechanically connected to the flexible board 10. The connecting portion 42c has a lower dynamic rigidity than the mounting portion 41c. For example, the thickness of the connecting portion 42c is smaller than that of the mounting portion 41c. More specifically, a dimension of the connecting portion 42c in the Z direction is smaller than that of the mounting portion 41c. The cutout 43c is formed between the mounting portion 41c and the connecting portion 42c. More specifically, the cutout 43c is a cutout extending from the +Y-direction side to the −Y-direction side as illustrated in FIGS. 4 and 5.

The image display device 1c according to the third embodiment has been described above. The image display device 1c includes the molded circuit component 40c in which the thickness of the connecting portion 42c is smaller than that of the mounting portion 41c. Accordingly, with the image display device 1c, it is possible to easily manufacture the connecting portion 42c having a lower dynamic rigidity than the mounting portion 41c.

The image display device 1c includes the cutout 43c which is formed between the mounting portion 41c and the connecting portion 42c. Accordingly, in the image display device 1c, a path along which a force generated due to bending, vibration, or the like of the flexible board 10 propagates to the vibrational structure 20 is set to be longer than that in the image display device 1a according to the first embodiment. As a result, the image display device 1c can curb application of a force generated due to bending, vibration, or the like of the flexible board 10 to the vibrational structure 20 in comparison with the image display device 1a according to the first embodiment.

Fourth Embodiment

Figure 6:
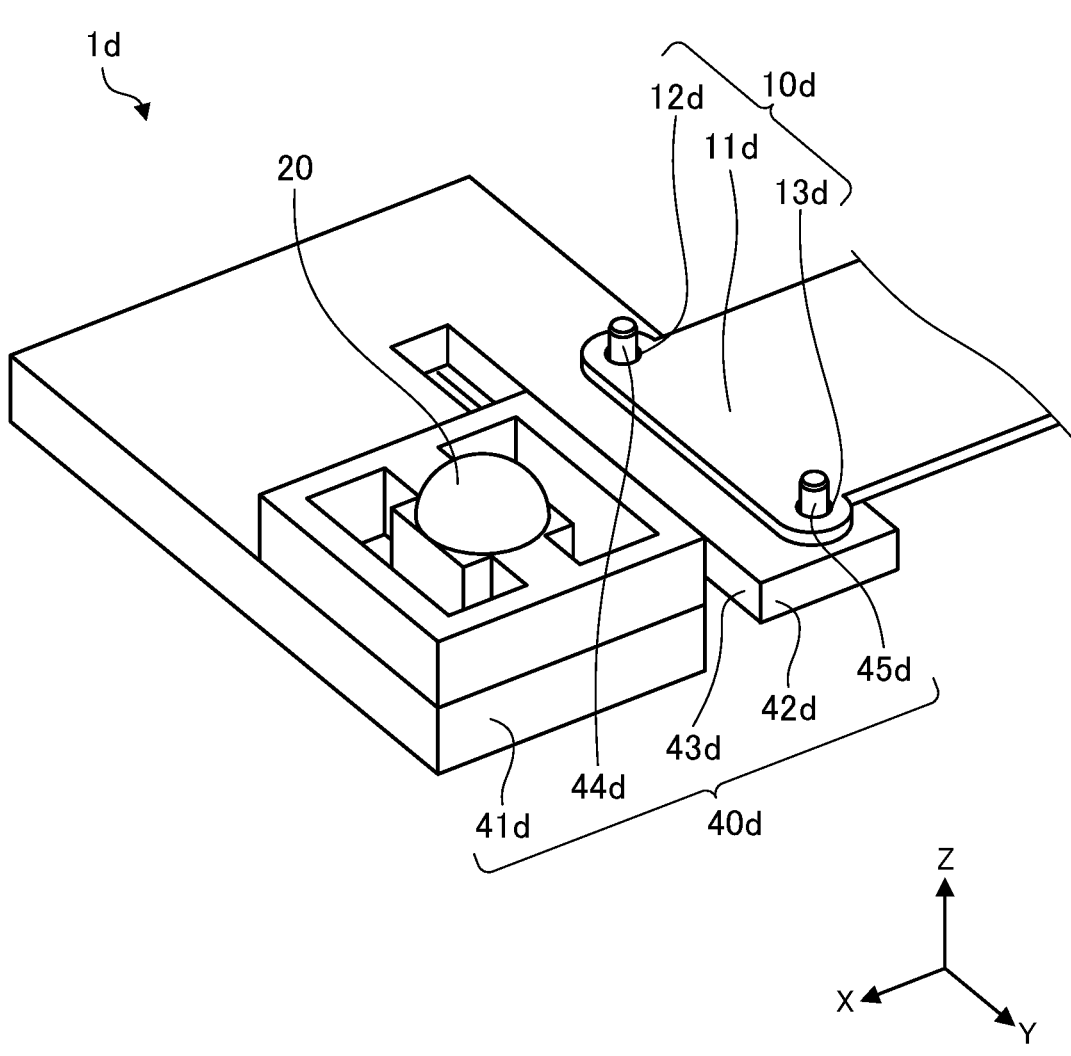
FIG. 6 is a partial perspective view of an image display device according to a fourth embodiment.

An image display device according to a fourth embodiment will be described below with reference to FIG. 6. FIG. 6 is a partial perspective view of the image display device according to the fourth embodiment. In description of the fourth embodiment, the same elements as in the aforementioned embodiments are referred to by the same reference signs. In description of the fourth embodiment, description of details mentioned in the aforementioned embodiments will be appropriately omitted, and details different from those of the aforementioned embodiments will be mainly described.

As illustrated in FIG. 6, an image display device 1d includes a flexible board 10d, a vibrational structure 20, and a molded circuit component 40d. Similarly to the image display device according to the aforementioned embodiments, the image display device 1d includes a magnetic field generator 30 and a base 50.

The flexible board 10d includes a mounting portion 11d, a hole 12d, and a hole 13d. The mounting portion 11d is a portion on which wires, electrodes, electronic components, and the like are mounted and has flexibility. A protrusion 44d which will be described later is inserted into the hole 12d. A protrusion 45d which will be described later is inserted into the hole 13d.

The molded circuit component 40d is an MID. The molded circuit component 40d delivers electric power, signals, and the like to be supplied to the vibrational structure 20 and signals and the like output from the vibrational structure 20. As illustrated in FIG. 6, the molded circuit component 40d includes a mounting portion 41d, a connecting portion 42d, a cutout 43d, a protrusion 44d, and a protrusion 45d.

The mounting portion 41d is electrically connected to the vibrational structure 20, and the vibrational structure 20 is mounted thereon. The connecting portion 42d is electrically and mechanically connected to the flexible board 10. The connecting portion 42d has a lower dynamic rigidity than the mounting portion 41d. For example, the thickness of the connecting portion 42d is smaller than that of the mounting portion 41d. More specifically, a dimension of the connecting portion 42d in the Z direction is smaller than that of the mounting portion 41d. The cutout 43d is formed between the mounting portion 41d and the connecting portion 42d. More specifically, the cutout 43d is a cutout extending from the +Y-direction side to the −Y-direction side as illustrated in FIG. 6. The protrusion 44d and the protrusion 45d are members protruding in the +Z direction from a surface on the +Z-direction side of the connecting portion 42d. The protrusion 44d is inserted into the hole 12d as illustrated in FIG. 6. The protrusion 45d is inserted into the hole 13d as illustrated in FIG. 6.

The image display device 1d according to the fourth embodiment has been described above. The image display device 1d includes the molded circuit component 40d in which the thickness of the connecting portion 42d is smaller than that of the mounting portion 41d. Accordingly, with the image display device 1d, it is possible to easily manufacture the connecting portion 42d having a lower dynamic rigidity than the mounting portion 41d.

The image display device 1d includes the cutout 43d which is formed between the mounting portion 41d and the connecting portion 42d. Accordingly, in the image display device 1d, a path along which a force generated due to bending, vibration, or the like of the flexible board 10 propagates to the vibrational structure 20 is set to be longer than that in the image display device 1a according to the first embodiment. As a result, the image display device 1d can curb application of a force generated due to bending, vibration, or the like of the flexible board 10 to the vibrational structure 20 in comparison with the image display device 1a according to the first embodiment.

The image display device 1d includes the flexible board 10d in which the hole 12d and the hole 13d are formed. The image display device 1d includes the connecting portion 42d in which the protrusion 44d inserted into the hole 12d and the protrusion 45d inserted into the hole 13d are formed. Accordingly, with the image display device 1d, it is possible to determine a single position at which the flexible board 10d is electrically and mechanically connected to the connecting portion 42d.

In the fourth embodiment, an example in which the hole 12d and the hole 13d are formed in the flexible board 10d and the protrusion 43d and the protrusion 44d are formed in the connecting portion 42d has been described, but the present invention is not limited thereto. At least two holes into which a protrusion is inserted have only to be formed in the flexible board according to the fourth embodiment. The positions of the holes are not particularly limited. At least two protrusions which are inserted into such holes have only to be formed in the flexible board according to the fourth embodiment. The positions of such protrusions are not particularly limited.

Fifth Embodiment

Figure 7:
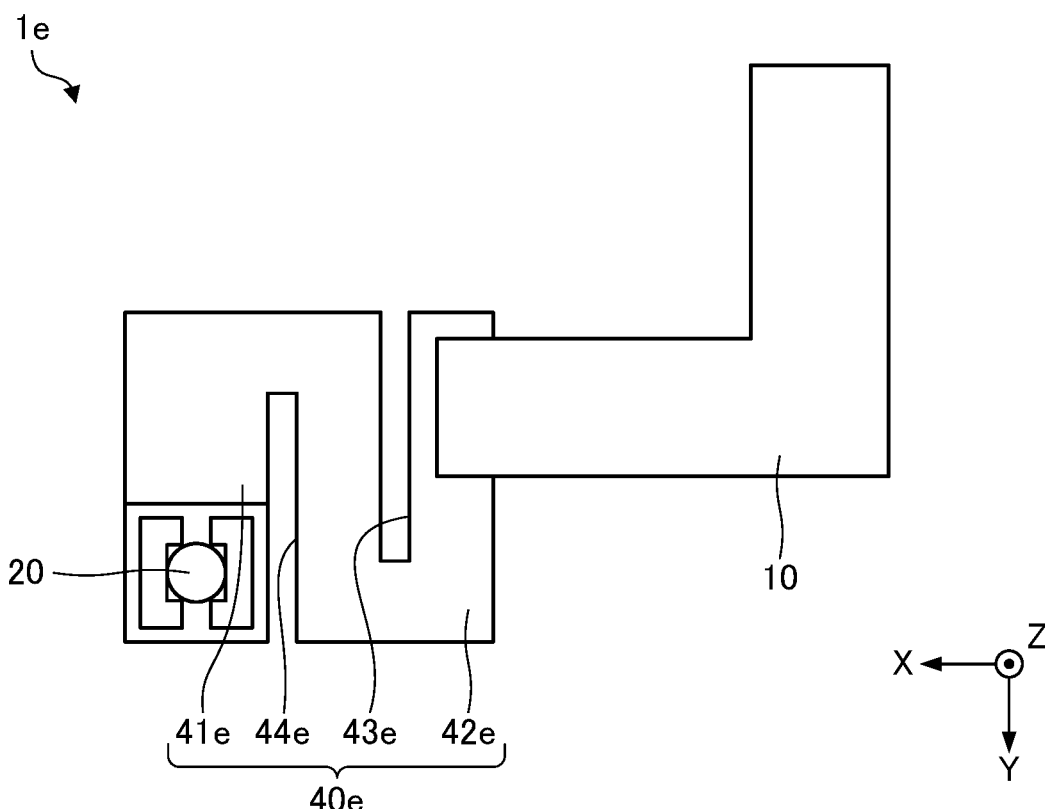
FIG. 7 is a partial view of an image display device according to a fifth embodiment when seen from a +Z-direction side.

An image display device according to a fifth embodiment will be described below with reference to FIG. 7. FIG. 7 is a partial view of the image display device according to the fifth embodiment when seen from the +Z-direction side. In description of the fifth embodiment, the same elements as in the aforementioned embodiments are referred to by the same reference signs. In description of the fifth embodiment, description of details mentioned in the aforementioned embodiments will be appropriately omitted, and details different from those of the aforementioned embodiments will be mainly described.

As illustrated in FIG. 7, an image display device 1e includes a flexible board 10, a vibrational structure 20, and a molded circuit component 40e. Similarly to the image display device according to the aforementioned embodiments, the image display device 1e includes a magnetic field generator 30 and a base 50.

The molded circuit component 40e is an MID. The molded circuit component 40e delivers electric power, signals, and the like to be supplied to the vibrational structure 20 and signals and the like output from the vibrational structure 20. As illustrated in FIG. 7, the molded circuit component 40e includes a mounting portion 41e, a connecting portion 42e, a cutout 43e, and a cutout 44e.

The mounting portion 41e is electrically connected to the vibrational structure 20, and the vibrational structure 20 is mounted thereon. The connecting portion 42e is electrically and mechanically connected to the flexible board 10. The connecting portion 42e has a lower dynamic rigidity than the mounting portion 41e. For example, the thickness of the connecting portion 42e is smaller than that of the mounting portion 41e. More specifically, a dimension of the connecting portion 42e in the Z direction is smaller than that of the mounting portion 41e. The cutout 43e is formed between the mounting portion 41e and the connecting portion 42e. More specifically, the cutout 43e is a cutout extending from the −Y-direction side to the +Y-direction side as illustrated in FIG. 7. The protrusion 44e is formed between the mounting portion 41e and the connecting portion 42e. More specifically, the cutout 44e is a cutout extending from the +Y-direction side to the −Y-direction side as illustrated in FIG. 7.

The image display device 1e according to the fifth embodiment has been described. The image display device 1e includes the cutout 43e and the cutout 44e which are formed between the mounting portion 41e and the connecting portion 42e. Accordingly, in the image display device 1e, a path along which a force generated due to bending, vibration, or the like of the flexible board 10 propagates to the vibrational structure 20 is set to be longer than that in the image display device 1c according to the third embodiment. As a result, the image display device 1e can curb application of a force generated due to bending, vibration, or the like of the flexible board 10 to the vibrational structure 20 in comparison with the image display device 1c according to the third embodiment.

An example in which one cutout is formed in a board has been described in the third embodiment and the fourth embodiment, and an example in which two cutouts are formed in the board has been described in the fifth embodiment, but the present invention is not limited thereto. The image display device according to the three embodiments may include a board in which three or more cutouts are formed. The image display device according to the three embodiments preferably includes a board in which a cutout extending from the +Y-direction side to the −Y-direction side and a cutout extending from the −Y-direction side to the +Y-direction side are alternately formed from the vibrational structure 20 to the flexible board 10. That is, the image display device according to the three embodiments preferably includes a board meandering from the vibrational structure 20 to the flexible board 10.

Sixth Embodiment

Figure 8:
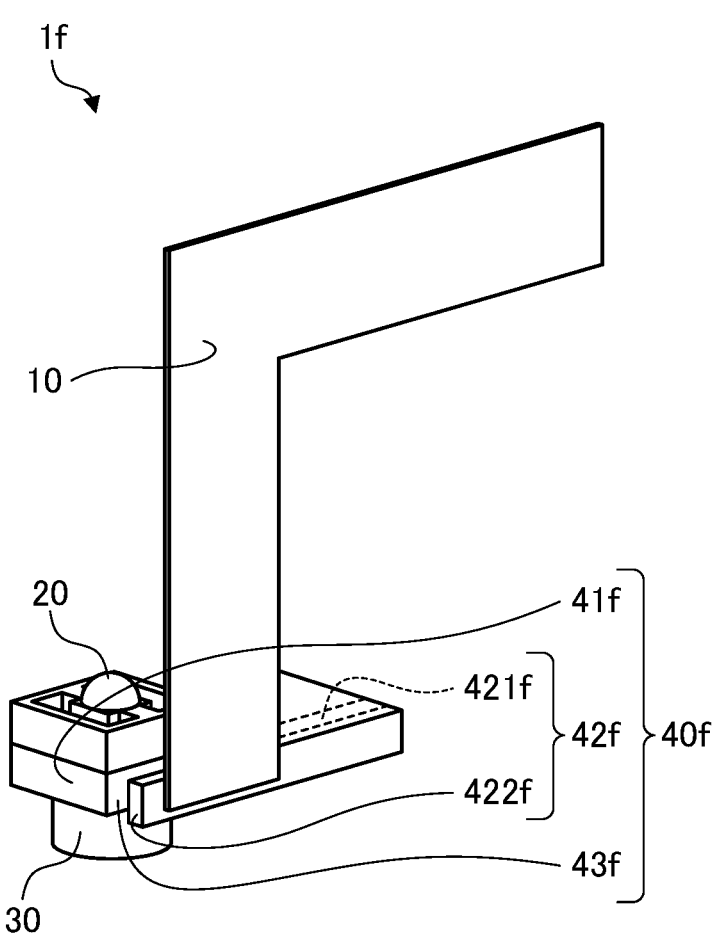
FIG. 8 is a partial perspective view of an image display device according to a sixth embodiment.
Figure 9:
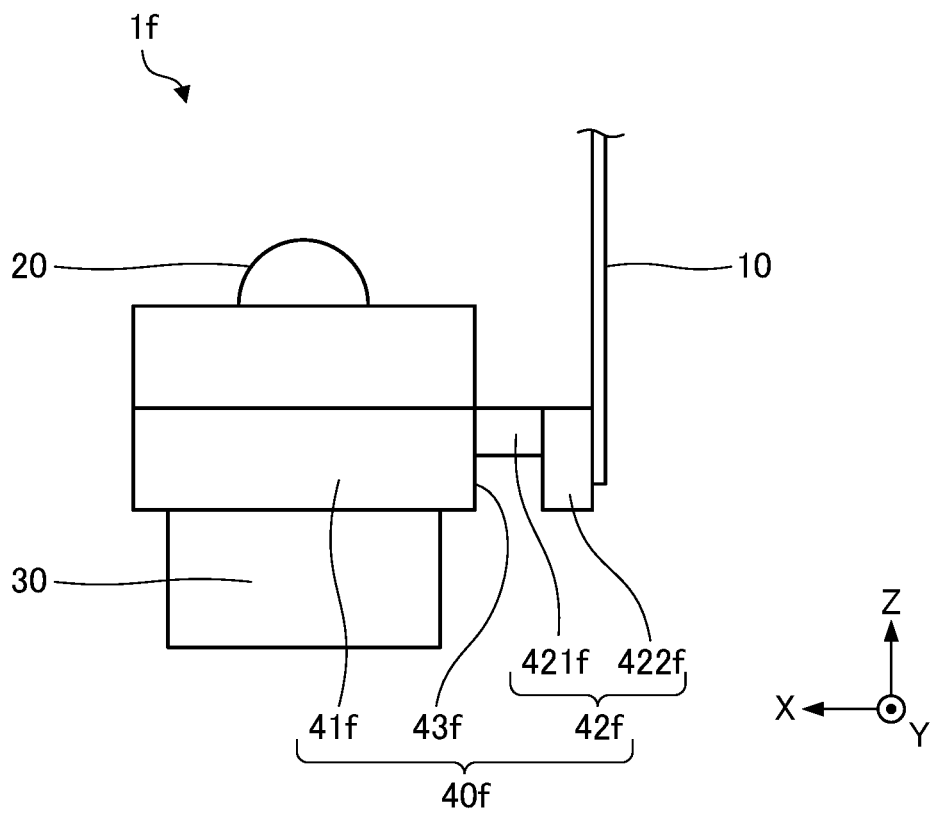
FIG. 9 is a partial view of the image display device according to the sixth embodiment when seen from the +Y-direction side.

An image display device according to a sixth embodiment will be described below with reference to FIGS. 8 and 9. FIG. 8 is a partial perspective view of the image display device according to the sixth embodiment. FIG. 9 is a partial view of the image display device according to the sixth embodiment when seen from the +Y-direction side. In description of the sixth embodiment, the same elements as in the aforementioned embodiments are referred to by the same reference signs. In description of the sixth embodiment, description of details mentioned in the aforementioned embodiments will be appropriately omitted, and details different from those of the aforementioned embodiments will be mainly described.

As illustrated in FIGS. 8 and 9, an image display device 1f includes a flexible board 10, a vibrational structure 20, a magnetic field generator 30, and a molded circuit component 40f. Similarly to the image display device according to the aforementioned embodiments, the image display device 1f includes a base 50.

The molded circuit component 40f is an MID. The molded circuit component 40f delivers electric power, signals, and the like to be supplied to the vibrational structure 20 and signals and the like output from the vibrational structure 20. As illustrated in FIGS. 8 and 9, the molded circuit component 40f includes a mounting portion 41f, a connecting portion 42f, and a cutout 43f.

The mounting portion 41f is electrically connected to the vibrational structure 20, and the vibrational structure 20 is mounted thereon. The connecting portion 42f is electrically and mechanically connected to the flexible board 10. The connecting portion 42f includes a first member 421f and a second member 422f as illustrated in FIGS. 8 and 9.

The first member 421f has a smaller thickness than the mounting portion 41f and is connected to an end surface of the mounting portion 41f. More specifically, the first member 421f has a smaller dimension in the Z direction than the mounting portion 41f and is connected to an end surface on the −X-direction side of the mounting portion 41f as illustrated in FIG. 9. In other words, the first member 421f has a smaller thickness in a first direction than the mounting portion 41f and is connected to an end surface on the −X-direction side of the mounting portion 41f. Since the connecting portion 42f includes the first member 421f having a smaller thickness than the mounting portion 41f, the dynamic rigidity thereof is lower than that of the mounting portion 41f. The first member 421f is a plate-shaped member in which an area of a surface parallel to an XY plane is larger than those of the other surfaces.

The second member 422f has a larger thickness than the first member 421f and is connected to an end surface of the first member 421f. More specifically, the second member 422f has a larger dimension in the Z direction than the first member 421f and is connected to an end surface on the −X-direction side of the first member 421f as illustrated in FIG. 9. In other words, the second member 422f has a smaller thickness in a second direction perpendicular to the first direction than the mounting portion 41f than the thickness in the first direction of the mounting portion 41f. The second direction mentioned herein is, for example, the X direction or the Y direction. The second member 422f is a plate-shaped member in which an area of a surface parallel to a YZ plane is larger than those of the other surfaces.

The first member 421*f* and the second member 422*f* are perpendicular to each other when they are projected onto the ZX plane from the +Y-direction side or the −Y-direction side. Here, the first member 421*f* and the second member 422*f* may cross each other at an angle other than 90 degrees when they are projected onto the ZX plane from the +Y-direction side or the −Y-direction side.

The cutout 43*f* is formed between the mounting portion 41*f* and the connecting portion 42*f*. More specifically, the cutout 43*f* is a cutout extending from the +Y-direction side to the −Y-direction side as illustrated in FIG. 9. The cutout 43*f* is formed by setting the dimension in the Y direction of the first member 421*f* to be smaller than the dimension in the Y direction of the second member 422*f*.

The image display device 1*f* according to the sixth embodiment has been described. The image display device 1*f* includes the first member 421*f* and the second member 422*f*. Accordingly, in the image display device 1*f*, a component of a force which is generated due to bending, vibration, or the like of the flexible board 10 and parallel to the Z direction is attenuated by the first member 421*f*, and a component of the force parallel to the X direction is attenuated. As a result, the image display device 1*f* can curb application of a force generated due to bending, vibration, or the like of the flexible board 10 to the vibrational structure 20 in comparison with the image display device 1*a* according to the first embodiment.

The image display device 1*f* includes the cutout 43*f* which is formed between the mounting portion 41*f* and the connecting portion 42*f*. Accordingly, in the image display device 1*f*, a path along which a force generated due to bending, vibration, or the like of the flexible board 10 propagates to the vibrational structure 20 is set to be longer than that in the image display device 1*a* according to the first embodiment. As a result, the image display device 1*f* can curb application of a force generated due to bending, vibration, or the like of the flexible board 10 to the vibrational structure 20 in comparison with the image display device 1*a* according to the first embodiment.

In the aforementioned embodiments, the board is a molded circuit component which is formed of a single type of resin, but the present invention is not limited thereto. For example, the board according to the aforementioned embodiments may include a connecting portion that is formed of a material with a lower dynamic rigidity than the mounting portion.

The board according to the aforementioned embodiments may include a connecting portion in which a groove is formed and thus the dynamic rigidity is lower than that in a case in which the groove is not formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-63464, filed Apr. 10, 2023, which is hereby incorporated by reference wherein in its entirety.

What is claimed is:

1. An image display device comprising: a flexible board; a vibrational structure including a light reflecting film for reflecting light; and a molded circuit component including a mounting portion which is electrically connected to the vibrational structure and on which the vibrational structure is mounted and a connecting portion which is electrically and mechanically connected to the flexible board and which has a lower dynamic rigidity than the mounting portion, wherein the flexible board and the vibrational structure are electrically connected via the molded circuit component, wherein the connecting portion of the molded circuit component includes a first member which has a smaller thickness in a first direction than the mounting portion and which is connected to an end surface of the mounting portion and a second member which has a smaller thickness in a second direction perpendicular to the first direction than that of the mounting portion in the first direction and which is connected to an end surface of the first member when the first direction is defined as a direction perpendicular to a surface on which the vibrational structure is mounted.

2. The image display device according to claim 1, wherein a thickness of the connecting portion of the molded circuit component in a first direction is smaller than that of the mounting portion when the first direction is defined as a direction perpendicular to a surface on which the vibrational structure is mounted.

3. The image display device according to claim 2, wherein the connecting portion of the molded circuit component is connected to a position farther from the vibrational structure than a position of the surface on which the vibrational structure is mounted on an end surface of the mounting portion.

4. The image display device according to claim 1, wherein the connecting portion of the molded circuit component is formed of a material with a lower dynamic rigidity than the mounting portion.

5. The image display device according to claim 1, wherein a groove is formed in the connecting portion of the molded circuit component such that a dynamic rigidity of the connecting portion is lower than that when the groove is not formed.

6. The image display device according to claim 1, wherein a cutout is formed between the mounting portion and the connecting portion of the molded circuit component.

7. The image display device according to claim 1, wherein at least two holes are formed in the flexible board, and
   wherein at least two protrusions which are inserted into the holes are formed in the connecting portion of the molded circuit component.

8. The image display device according to claim 1, further comprising a base,
   wherein the mounting portion of the molded circuit component is supported by the base.

\* \* \* \* \*